(12) United States Patent
Shen et al.

(10) Patent No.: US 11,438,021 B2
(45) Date of Patent: Sep. 6, 2022

(54) METHOD AND SYSTEM FOR HYBRID MODULATION AND DEMODULATION

(71) Applicant: INTELLIGENT FUSION TECHNOLOGY, INC., Germantown, MD (US)

(72) Inventors: Dan Shen, Germantown, MD (US); Khanh Pham, Kirtland AFB, NM (US); Tien M. Nguyen, Yorba Linda, CA (US); Genshe Chen, Germantown, MD (US)

(73) Assignee: INTELLIGENT FUSION TECHNOLOGY, INC., Germantown, MD (US)

( * ) Notice: Subject to any disclaimer, the term of this patent is extended or adjusted under 35 U.S.C. 154(b) by 0 days.

(21) Appl. No.: 17/167,674

(22) Filed: Feb. 4, 2021

(65) Prior Publication Data

US 2022/0247443 A1   Aug. 4, 2022

(51) Int. Cl.
| | |
|---|---|
| *H04B 1/30* | (2006.01) |
| *H03D 1/22* | (2006.01) |
| *H03D 1/24* | (2006.01) |
| *H04B 1/04* | (2006.01) |

(52) U.S. Cl.
CPC ............. *H04B 1/30* (2013.01); *H03D 1/2254* (2013.01); *H03D 1/24* (2013.01); *H04B 1/04* (2013.01)

(58) Field of Classification Search
USPC ........ 329/170, 347, 357, 363; 375/130, 133, 375/219, 260, 262, 267, 295, 316
See application file for complete search history.

(56) References Cited

U.S. PATENT DOCUMENTS

2020/0266853 A1*   8/2020   Strobel ..................... H04L 5/14

OTHER PUBLICATIONS

Dan Shen, "SSB and DSB Enabled Hybrid Waveforms for the Space-Ground Link System" IEEE, Nov. 1, 2019 (Year: 2019).*

* cited by examiner

*Primary Examiner* — Shawkat M Ali
(74) *Attorney, Agent, or Firm* — Anova Law Group, PLLC

(57) ABSTRACT

A system for hybrid modulation and demodulation includes a transmitter and a receiver. The transmitter is configured to receive a hybrid signal of a space-ground link system (SGLS), including a first component and a second component; perform a double sideband (DSB) modulation on the first component using a carrier frequency to obtain a first waveform; perform a single sideband (SSB) modulation on the second component using the carrier frequency to obtain a second waveform; mix the first waveform and the second waveform to generate a hybrid waveform; and transmit the hybrid waveform. The receiver is configured to receive the hybrid waveform; determine the carrier frequency; separate the first waveform and the second waveform; perform a DSB demodulation on the first waveform to obtain a first demodulated signal; and perform an SSB demodulation on the second waveform to obtain a second demodulated signal.

20 Claims, 15 Drawing Sheets

METHOD AND SYSTEM FOR HYBRID MODULATION AND DEMODULATION

GOVERNMENT RIGHTS

This invention was made with Government support under Contracts No. FA9453-15-C-0401 and No. FA9453-18-C-0005, awarded by the United States Air Force Research Laboratory (AFRL). The U.S. Government has certain rights in this invention.

FIELD OF THE DISCLOSURE

The disclosure generally relates to the field of satellite communication (SATCOM) technology and, more particularly, relates to a method and a system for hybrid modulation and demodulation.

BACKGROUND

The Air Force Satellite Control Network (AFSCN) is a satellite control network that is acquired and sustained by the Air Force Space and Missile Systems Center (SMC) for HQ Air Force Space Command (AFSPC). The AFSCN provides command, tracking, and telemetry support to assigned satellite missions. The Air Force SGLS is the primary component of this network, and provides tracking, telemetry and command (TT&C) functions with satellites that perform missile warning, navigation, military satellite communications (SATCOM), weather tracking and reporting, as well as intelligence, surveillance, and reconnaissance (ISR). The standard SGLS waveform combines the TT&C signals together and uses a phase modulation scheme for the transmission. The uplink SGLS is operating in the frequency range from 1755 to 1850 MHz in the L-band, and the downlink uses 2200 to 2290 MHz in the S-band.

The Advanced Wireless Services 3 (AWS-3) auction concluded in 2015 begins the DoD's transition to vacate and/or share the 1695-1710 MHz and 1755-1780 MHz bands. The DoD Transition Plans are the foundation for how DoD will make these bands available for commercial mobile broadband usage.

The spectrum sharing plan calls for the solutions to compress the uplink SGLS spectrum and minimize the interference to the neighboring bandwidth. The solutions need be able to solve the operational challenges and retire the risk that was assumed resulting from the transitions of the affected systems. Solutions to these problems and risks also represent an opportunity for DoD to achieve enhanced capability via solutions that address the challenges of commonality, agility, and efficiency.

The disclosed method and system for hybrid modulation and demodulation are directed to solving one or more problems set forth above and other problems in the art.

BRIEF SUMMARY OF THE DISCLOSURE

The present disclosure provides a system for hybrid modulation and demodulation. The system includes a transmitter and a receiver. The transmitter is configured to receive a hybrid signal of a space-ground link system (SGLS), the hybrid signal including a first component and a second component; perform a double sideband (DSB) modulation on the first component of the hybrid signal using a carrier frequency to obtain a first waveform; perform a single sideband (SSB) modulation on the second component of the hybrid signal using the carrier frequency to obtain a second waveform; mix the first waveform and the second waveform to generate a hybrid waveform; and transmit the hybrid waveform for the SGLS. The receiver is configured to receive the hybrid waveform from the transmitter; determine the carrier frequency of the hybrid waveform; separate the first waveform and the second waveform of the hybrid waveform; perform, based on the carrier frequency, a DSB demodulation on the first waveform to obtain a first demodulated signal; and perform, based on the carrier frequency, an SSB demodulation on the second waveform to obtain a second demodulated signal.

Another aspect of the present disclosure provides a hybrid modulation method. The hybrid modulation method includes inputting a hybrid signal of a space-ground link system (SGLS), the hybrid signal including a first component and a second component; performing a double sideband (DSB) modulation on the first component of the hybrid signal using a carrier frequency to obtain a first waveform; performing a single sideband (SSB) modulation on the second component of the hybrid signal using the carrier frequency to obtain a second waveform; and mixing the first waveform and the second waveform to generate a hybrid waveform for the SGLS with reduced bandwidth and improved spectrum efficiency.

Another aspect of the present disclosure provides a hybrid demodulation method. The hybrid demodulation method includes receiving a hybrid waveform of a space-ground link system (SGLS); determining a carrier frequency of the hybrid waveform; obtaining a first waveform by passing the received hybrid waveform through a first bandpass filter and a second waveform by passing the received hybrid waveform through a second bandpass filter; performing, based on the carrier frequency, a double sideband (DSB) on the first waveform to obtain a first demodulated signal; and performing, based on the carrier frequency, a single sideband (SSB) demodulation on the second waveform to obtain a second demodulated signal.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or similar parts.

Figure 1:
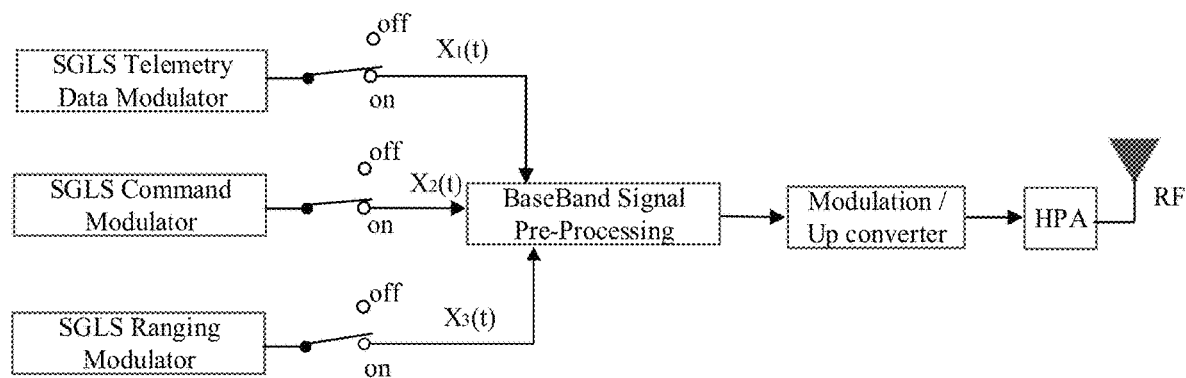
FIG. 1 illustrates a schematic structural view of a space-ground link subsystem (SGLS) uplink waveform.

The space-ground link subsystem (SGLS) is a subsystem used as a prime source of tracking, telemetry data, and command and control capability in support-of satellite programs which are serviced by the Air Force Satellite Control Network (AFSCN). The original standard SGLS uplink waveform includes three components, e.g., telemetry, command, and ranging. FIG. 1 illustrates a schematic structural view of an SGLS uplink waveform. Referring to FIG. 1, the baseband signal g(t) of the SLGLS uplink waveform is formed by telemetry data $x_1(t)$, command data $x_2(t)$, and ranging data $x_3(t)$.

The telemetry data, $x_1(t)$, is defined as $x_1(t)=d(t)\sin(2\pi f_{d1} t)$, where d(t) is ±1 and $f_{d1}$ is the telemetry subcarrier frequency. A typical value of $f_{d1}$ is 1.25 MHz.

The command signal adopts a PCM/FSK/AM modulation scheme. The command data are first frequency-shift keyed (FSK) onto three possible sinusoidal frequency tones, and then amplitude modulated (AM) using a triangular subcarrier waveform to shape up the envelope. The three frequency tones are at 65 KHz, 76 KHz, and 95 KHz when the command rate is 1 Kbps or 2 Kbps. The command data $x_2(t)$ is formulated as, $$x_2(t) = (1 + Km(t))\sum\nolimits_{k=-\infty}^{\infty} \sin(2\pi f_{sc}^k t)P_{cmd}(t - kT_{cmd}) \quad (1)$$

where $f_{hd\ sc}^k \in \{65\ \text{kHz}, 76\ \text{kHz}, 95\ \text{kHz}\}$ and $P_{cmd}(t)$ is unit square pulses with $T_{cmd}=1/R_{cmd}$, $R_{cmd}$ is the command data rate, m(t) denotes the triangular sub-carrier waveform, and K is usually set to be 0.5.

$$m(t) = \begin{cases} \dfrac{(t - iT_{cmd})}{T_{cmd}}, & \text{when } iT_{cmd} \le t < iT_{cmd} + \dfrac{T_{cmd}}{2}; \\ \dfrac{1}{2} - \dfrac{t - iT_{cmd} - \dfrac{T_{cmd}}{2}}{T_{cmd}}, & \text{when } iT_{cmd} + \dfrac{T_{cmd}}{2} \le t < iT_{cmd} + \dfrac{3T_{cmd}}{2}; \\ -\dfrac{1}{2} + \dfrac{t - iT_{cmd} - \dfrac{3T_{cmd}}{2}}{T_{cmd}}, & \text{when } iT_{cmd} + \dfrac{3T_{cmd}}{2} \le t < (i + 2)T_{cmd}. \end{cases} \quad (2)$$

The standard SGLS ranging signal is a pseudorandom noise (PSN) sequence. The definition is denoted as, $$x_3(t) = \Sigma_{k=-\infty}^{\infty} d_r^k P_r(t - kT_r),$$

where $d_r^k = \pm 1$ is the PN ranging code and $P_r(t)$ is unit square pulses with $T_r=1/R_c$, $R_c$, is the chip rate.

Figure 2:
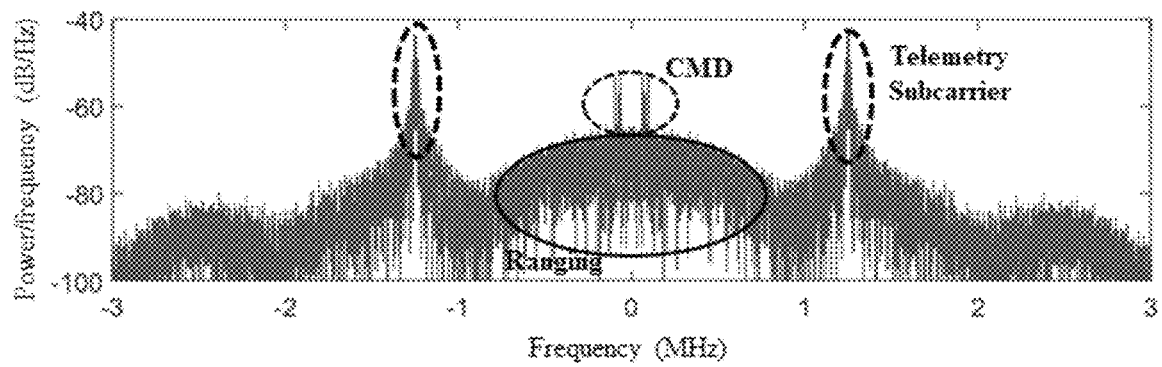
FIG. 2 illustrates an exemplary power spectral density (PSD) of a baseband signal combining telemetry data, command data, and ranging data.

The uplink SGLS signal could be described as $x_{DSB}(t)=\sqrt{2P_T}\cos(2\pi f_c t+g(t)+\phi_c)$, where $P_T$ is the total transmitted power (for the simplicity purpose, $\sqrt{2P_T}$ is set as 1 in the present disclosure), $\phi_c$ is the initial carrier phase, $f_c$ is the carrier frequency, g(t) is the combination of the three signals, including telemetry, command and ranging data. It could be expressed as $g(t)=\beta_1 x_1(t)+\beta_2 x_2(t)+\beta_3 x_3(t)$, where $\beta_i$ is the modulation index and has different values for the signals. For example, the typical values are $\beta_1=1.1$ rad, $\beta_2=0.3$ rad and $\beta_3=0.3$ rad. The phase modulation used for SGLS signal is a DSB modulation, which contains two parts in the modulated signal, e.g., the lower sideband (LSB) and upper sideband (USB). FIG. 2 illustrates an exemplary power spectral density (PSD) of a baseband signal combining telemetry data, command data, and ranging data.

The SSB waveform for SGLS may be denoted by $$x_{SSB}(t)=\text{Re}\ ((g(t)+j\cdot\hat{g}(t))\ \exp(j\cdot(2\pi f_c t+\phi_c))) \quad (3)$$

where $\hat{g}(t)$ is the Hilbert transform of g(t). Re(·) is the operator to return the real part of a complex number. In one embodiment, the transmission power is assumed to be 1. To compare the SSB with DSB, the DSB modulation may be rewritten as $$x_{DSB}(t)=\text{Re}(\exp(j\cdot(2\pi f_c t+g(t)+\phi_c))) \quad (4)$$

Figure 3:
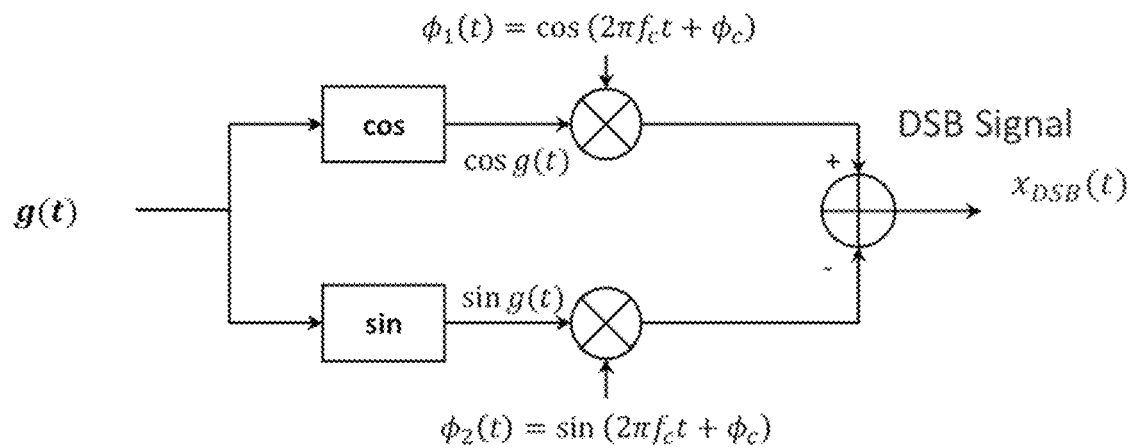
FIG. 3 illustrates a schematic implementation block diagram of a double sideband (DSB) modulation.
Figure 4:
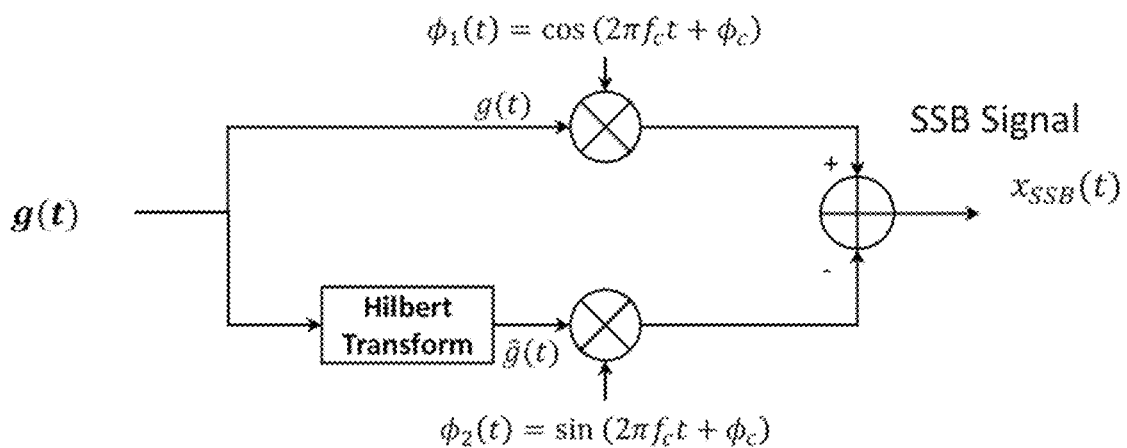
FIG. 4 illustrates a schematic implementation block diagram of a single sideband (SSB) modulation.
Figure 5:
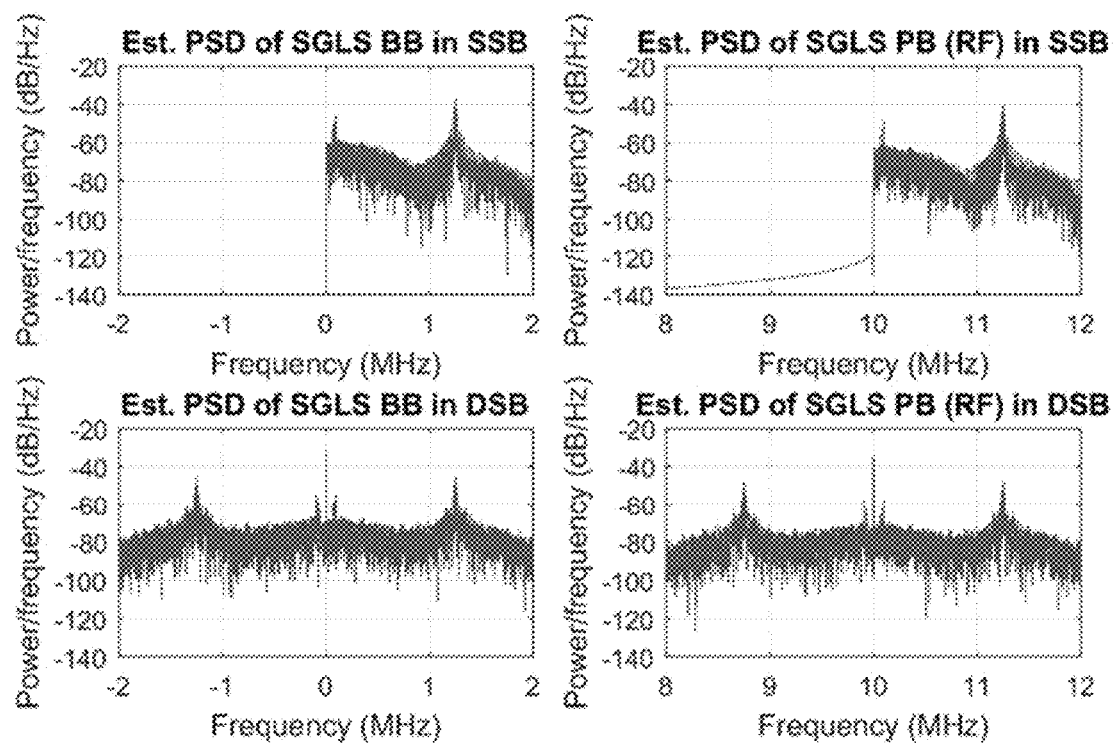
FIG. 5 illustrates a PSD comparison of signals in an SSB modulation and in a DSB modulation.

FIG. 3 illustrates a schematic implementation block diagram of a DSB modulation, and FIG. 4 illustrates a schematic implementation block diagram of an SSB modulation. Referring to FIG. 3 and FIG. 4, some structural similarities can be found between the DSB modulation and the SSB modulation. FIG. 5 illustrates a PSD comparison of signals in an SSB modulation and in a DSB modulation. In FIG. 5, BB is an abbreviation representing the baseband signal g(t), and PB is an abbreviation representing the passband or the RF signal $x_{DSB}$ or $x_{SSB}$. It should be noted that the PSD of the signal after the phase modulation is plotted in the bottom right panel of FIG. 5 with a carrier frequency (or intermediate frequency used in the simulation) 10 MHz. The power spectral density comparison results show the power efficiency and spectral efficiency of the proposed SSB modulation structure.

Figure 6:
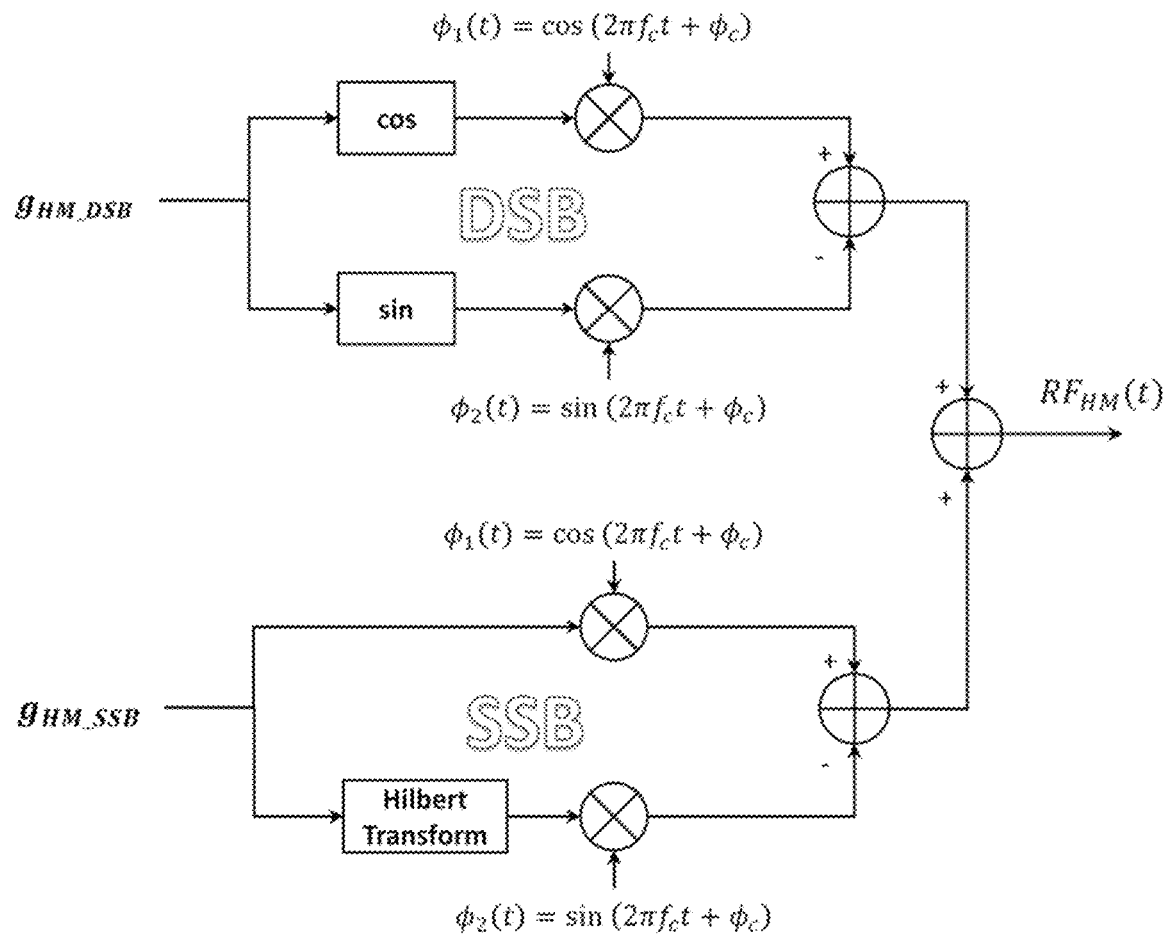
FIG. 6 illustrates a schematic block diagram of an exemplary hybrid modulation according to various embodiments of the present disclosure.

The present disclosure provides a hybrid modulation method. The method adopts a hybrid modulation (HM) process to keep the original double sideband command signal while generating single sideband telemetry and ranging signals, and accordingly, the method adopts a hybrid demodulation process to recover the command signal, the telemetry signal, and the ranging signal. The reason of maintaining the original command signal is to let the satellite demodulate the command data without updating the onboard processing capabilities. The idea of HM is to enable the original command signal modulation structure while applying the single sideband waveform to the telemetry data signal and the ranging signal. FIG. 6 illustrates a schematic block diagram of an exemplary hybrid modulation according to various embodiments of the present disclosure. Referring to FIG. 6, the upper part of the block diagram shows a double sideband command signal, and the lower part of the block diagram shows single sideband telemetry and ranging signals. The symbols in the FIG. 6 are defined as:

$$g_{HM\_SSB}(t) = \beta_1 x_1(t) + \beta_3 x_3(t) \quad (5)$$

$$g_{HM\_DSB}(t) = \beta_2 x_2(t) \quad (6)$$

$$\text{Baseband(DSB)} = e^{j[g(t)]} \quad (7)$$

$$\text{Passband(DSB)} = \text{Re}\{\text{Baseband(DSB)} \cdot e^{j[\omega_c t + \phi_c]}\} \quad (8)$$

$$\text{Baseband (HM)} = [g_{HM\_SSB}(t) + j\,\hat{g}_{HM\_SSB}(t)] + e^{j[g_{HM\_DSB}(t)]} \quad (9)$$

$$\text{Passband (HM)} = \text{Re}\{\text{Baseband(HM)} \cdot e^{j[\omega_c t + \phi_c]}\} \quad (10)$$

Figure 7:
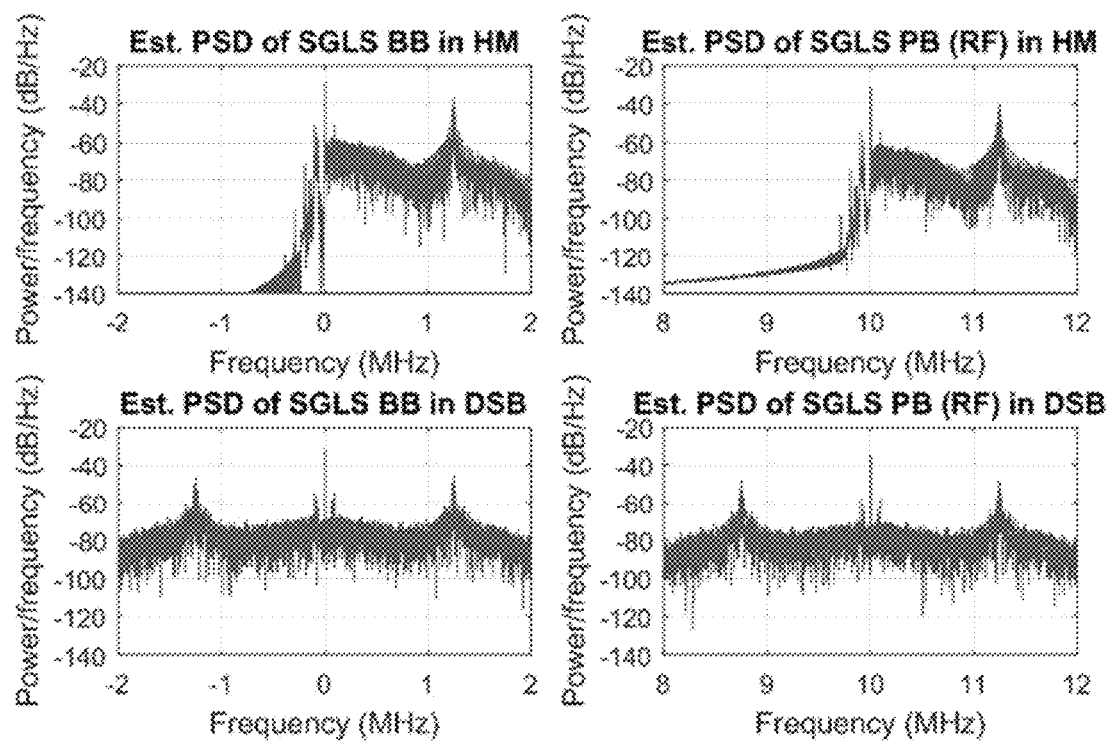
FIG. 7 illustrates a PSD comparison of signals in a DSB modulation and in a hybrid modulation.

The fundamental difference of the hybrid modulation and the aforementioned SSB modulation is maintaining the DSB of the command signal. FIG. 7 illustrates a PSD comparison of signals in a DSB modulation and in a hybrid modulation. Referring to FIG. 7, the results include both power efficiency and spectral efficiency of the DSB and the HM. The HM may be able to maintain hardware consistency in the satellite side while making use of the single sideband technique for power and spectral efficiency.

Carrier tracking is one of the major issues of demodulating the HM signals, especially when there exist Doppler shifts within the space and ground links. In view of the obtained results, a Costas Loop is designed based on the ranging signals. In the case that there is no ranging data, transmitting a power-reduced pilot tone may be necessary for transmitting the carrier information. In both cases, the same Costas Loop may be adopted.

Figure 8:
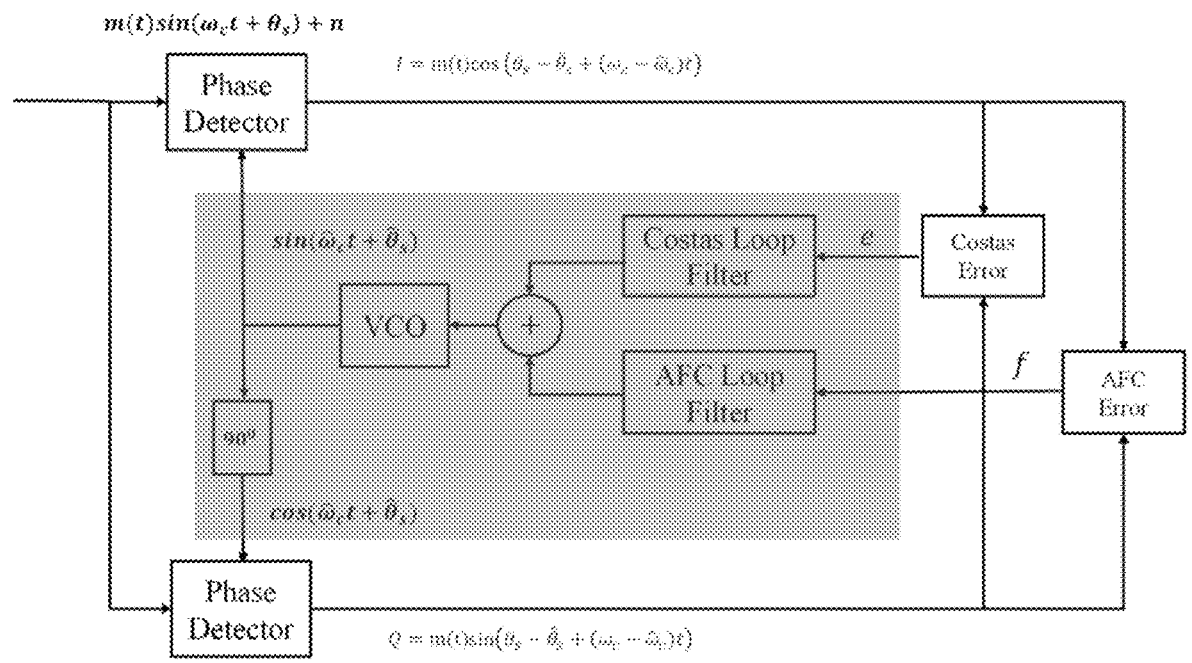
FIG. 8 illustrates a schematic diagram of a composite automatic frequency control-Costas (AFC/Costas) loop.

FIG. 8 illustrates a schematic diagram of a composite automatic frequency control-Costas (AFC/Costas) loop. Referring to FIG. 8, in one embodiment, a basic Costas loop may be proposed to track the carrier frequencies and phases. The input signals may include radio frequency (RF) signals with noises. Based on the auto-adjusted reference signals $\sin(\hat{\omega}_c t + \hat{\theta}_s)$ and $\cos(\hat{\omega}_c t + \hat{\theta}_s)$, the Costas error $e$ and automatic frequency control (AFC) error $f$ can be computed.

When the Costas loop is implemented using a computer, the frequency and phase update laws (the shaded area in FIG. 8) based on $e$ and $f$ may be listed as $$e_{k+1} = 2\text{sign}(I_{k+1})Q_{k+1} \quad (11)$$

$$X_{k+1} = I^2_{k+1} - Q^2_{k+1} \quad (12)$$

$$Y_{k+1} = I_{k+1}Q_{k+1} \quad (13)$$

$$f_{k+1} = X_k Y_{k+1} - X_{k+1} Y_k \quad (14)$$

$$\hat{\theta}_{k+1} = \hat{\theta}_k + \hat{\omega}_k T + c_1 e_k \quad (15)$$

$$\hat{\omega}_{k+1} = \hat{\omega}_k + c_2 e_k + d_1 f_k \quad (16)$$

where $c_1 = \sqrt{2}\omega_n T$, $c_2 = \omega_n^2 T$, $$d_1 = \frac{1}{r}\omega_{nF},$$

$\omega_n = 1.89 B_L$ is the loop corner frequency in terms of noise bandwidth for the Costas loop, $\omega_{nF} = 4 B_{LF}$ is the loop corner frequency in terms of noise bandwidth for the AFC, and T is the sampling interval.

Figure 9:
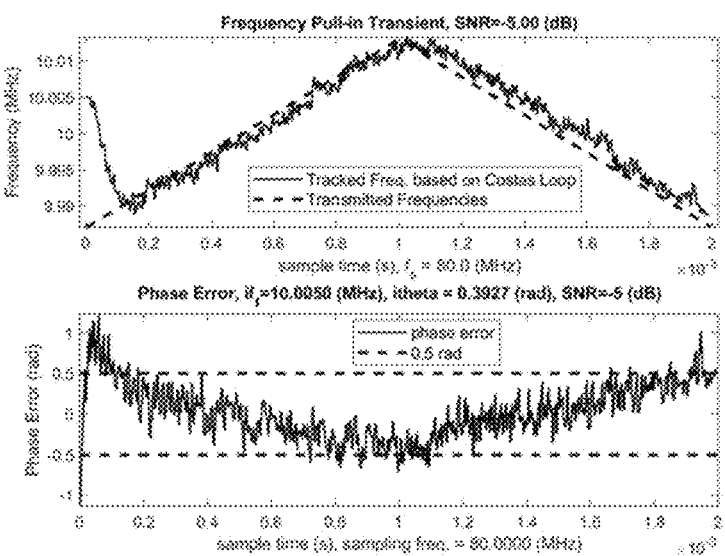
FIG. 9 illustrates an exemplary tracking performance simulation of a Costas loop.

In one example, to evaluate the tracking performance, a case with increasing then decreasing carrier frequencies is simulated. FIG. 9 an exemplary tracking performance simulation of a Costas loop. Referring to FIG. 9, the solid line represents the transmitted frequencies, and the signal-to-noise ratio (SNR) is set to −5 dB. The signal power may be the power of the HM signal, e.g., $RF_{HM}(t)$ in FIG. 6. Therefore, the phase mismatches may be within the ±0.5 rad for most times.

The received signal for the DSB phase modulation may be (for the illustration purpose, the channel fading and noises are ignored)

$$y_{DSB}(t) = \text{Re}(\exp(j \cdot (2\pi f_c t + g(t) = \phi_c))) \quad (17)$$

Moreover, a complex variable may be defined for DSB:

$$Y_{DSB}(t) = y_{DSB}(t) + j\text{Hilbert}(y_{DSB}(t)) \quad (18)$$

For a limited bandwidth signal $g(t)$, and a high enough carrier frequency, the $\exp(j \cdot (2\pi f_c t + g(t) + \phi_c))$ may be an analytic signal (e.g., a complex-valued function that has no negative frequency components). Based on the properties of Hilbert transform, $$Y_{DSB}(t) = \exp(j \cdot (2\pi f_c t + g(t) + \phi_c)) \quad (19)$$

with the assumption of perfect carrier synchronization, $$g_{DSB}(t) = \text{Angle}[Y_{DSB}(t) e^{-j(2\pi f_c t + \phi_c)}] \quad (20)$$

where the operator Angle computes the angle of a complex number.

Based on the modulation structures shown in FIG. 3 and FIG. 4, the double sideband demodulation and the single sideband demodulation also share several similarities. The received signal for the SSB phase modulation may be (for the illustration purpose, the channel fading and noises are ignored)

$$y_{SSB}(t) = \text{Re}((g(t) + j \cdot \hat{g}(t)) \exp(j \cdot (2\pi f_c t + \phi_c))). \quad (21)$$

Similarly, a complex variable may be defined for SSB:

$$Y_{SSB}(t) = y_{SSB}(t) + j\text{Hilbert}(y_{SSB}(t)) \quad (22)$$

Since $(g(t) + j \cdot \hat{g}(t))$ may be an analytic signal, $$Y_{SSB}(t) = [g(t) + j\hat{g}(t)] e^{j[2\pi f_c t + \phi]} \quad (23)$$

with the assumption of perfect carrier synchronization, $$g_{SSB}(t) = \text{Re}\left[Y_{SSB}(t)e^{-j(2\pi f_c t + \phi_c)}\right] \quad (24)$$

where the operator Re returns the real part of a complex number.

The present disclosure also provides a hybrid demodulation method. The hybrid demodulation method may be used to demodulate the hybrid waveform obtained using the disclosed hybrid modulation method. According to the disclosed hybrid modulation method, the original double sideband waveform is kept for command signals while a single sideband waveform is generated for telemetry and ranging signals. Therefore, to demodulate the hybrid waveform obtained through the hybrid modulation process, a hybrid demodulation process may be adopted. For example, the command data may be recovered through a DSB demodulation process, and the telemetry data and the ranging data may be recovered through an SSB demodulation process.

Figure 10:
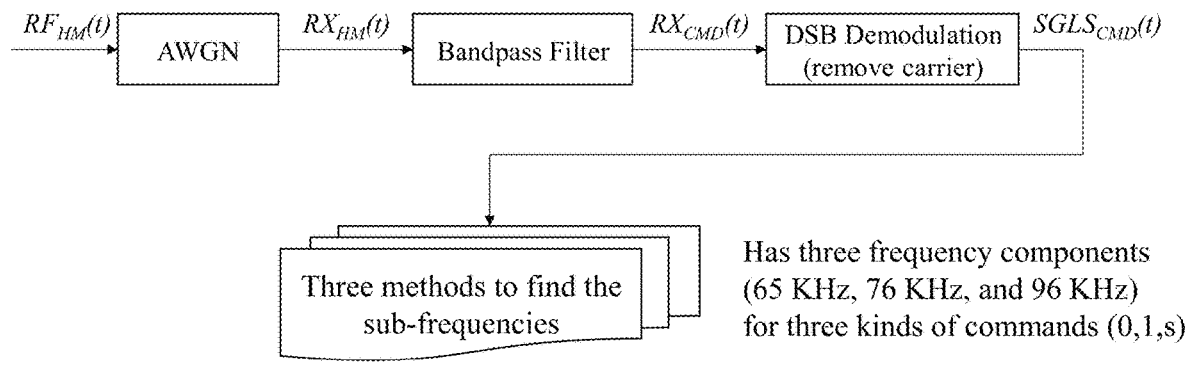
FIG. 10 illustrates a schematic block diagram of an exemplary process for demodulating command data from the hybrid modulation of SGLS according to various embodiments of the present disclosure.

FIG. 10 illustrates a schematic block diagram of an exemplary process for demodulating command data from the hybrid modulation of SGLS according to various embodiments of the present disclosure. Referring to FIG. 10, to simulate the received signal, e.g., $RX_{HM}(t)$, the hybrid modulation signal $RF_{HM}(t)$ may pass through an additive white Gaussian noise (AWGN) channel before sent to a bandpass filter. In one embodiment, the signal passing through the bandpass filter may be $RX_{CMD}(t)$. That is, only the signal carrying command data may be allowed to pass through the bandpass filter. Then, a DSB demodulation may be applied to the signal to remove the carrier frequencies, such that a demodulated signal $SGLS_{CMD}(t)$ may be obtained. Further, based on the DSB demodulated signal $SGLS_{CMD}(t)$, the subcarrier frequencies may be determined. For example, to find the subcarrier frequencies from the demodulated signal $SGLS_{CMD}(t)$, one of the following three methods may be used: i) finding peaks in fast Fourier transform (FFT) plots; ii) frequency tracking by a Costas loop; and iii) signal matching based on frequency correlation. All the three methods are found to provide accurate subcarrier frequencies from the demodulated signal $SGLS_{CMD}(t)$, and in the present disclosure, the first method, e.g., finding peaks in FFT plots, is described in detail for illustration due to the high computational efficiency of the method.

Figure 11:
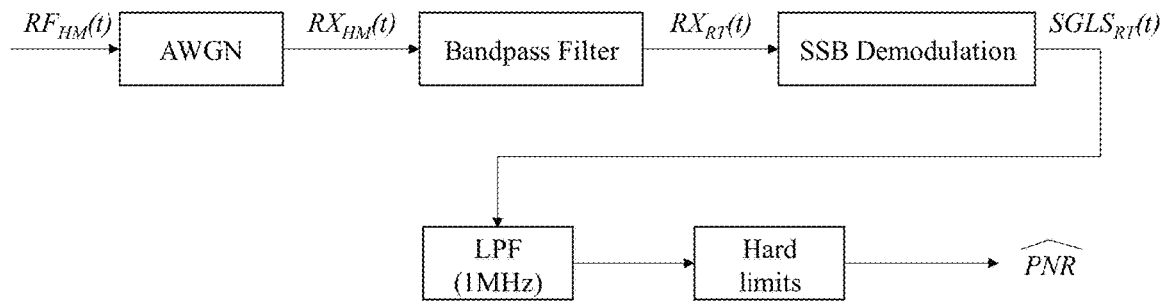
FIG. 11 illustrates a schematic block diagram of an exemplary process for demodulating ranging data according to various embodiments of the present disclosure.

In one embodiment, the distance between the satellite and the ground station may be determined by measuring the round-trip path delay of the signal transmitted to the satellite and received at the ground station. FIG. 11 illustrates a schematic block diagram of an exemplary process for demodulating ranging data according to various embodiments of the present disclosure. Referring to FIG. 11, to recover the ranging data, the hybrid modulation signal $RF_{HM}(t)$ may be sent to a bandpass filter through an AWGN channel to mimic the transmission of the hybrid waveform. In one embodiment, the signal passing through the bandpass filter may be $RX_{RT}(t)$, which carries both ranging data and telemetry data. Further, an SSB demodulation may be applied to the signal to remove the carrier frequencies, such that a demodulated signal $SGLS_{RT}(t)$ may be obtained. In one embodiment, after the demodulated signal $SGLS_{RT}(t)$ passing through a low pass filter (LPF), hard limits may be applied to the signal to recover the ranging data. In FIG. 11, PNR stands for Pseudorandom Noise for Ranging, which is the information used for detecting the distance between the satellite and the ground station.

Figure 12:
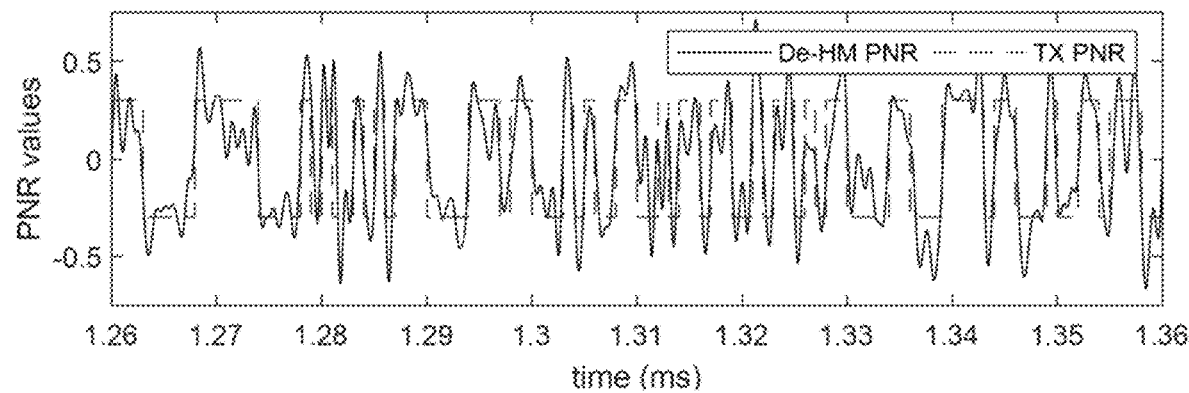
FIG. 12 illustrates a comparison of transmitted PNR and demodulated PNR (before applying hard limits) in an exemplary period.

FIG. 12 illustrates a comparison of transmitted PNR and demodulated PNR (before applying hard limits) in an exemplary period. It should be noted that the SNR is set to 0 dB. Based on the result shown in FIG. 12, although some distortions due to the SSB modulation can be identified, after applying the hard limits, the correct PNRs can still be obtained.

Figure 13:
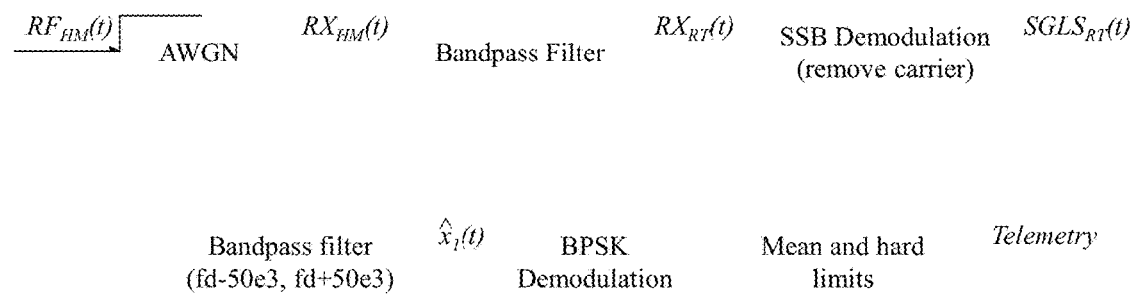
FIG. 13 illustrates a schematic block diagram of an exemplary process for demodulating telemetry data according to various embodiments of the present disclosure.
Figure 14:
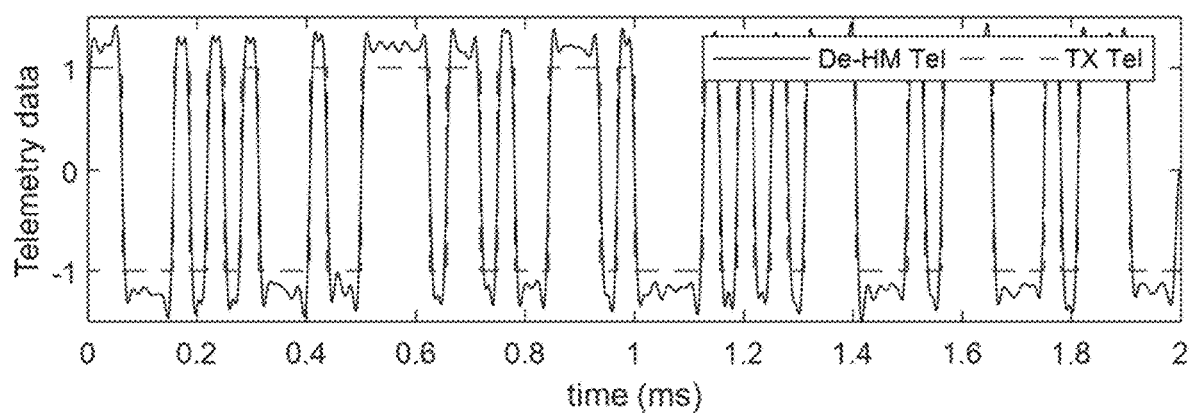
FIG. 14 illustrates exemplary demodulation results of telemetry data.

The last data to be demodulated is the telemetry. FIG. 13 illustrates a schematic block diagram of an exemplary process for demodulating telemetry data according to various embodiments of the present disclosure. Referring to FIG. 13, the hybrid modulation signal may be sent to a bandpass filter through an AWGN channel. In one embodiment, the signal passing through the bandpass filter may be $RX_{RT}(t)$. Further, an SSB demodulation may be applied to the signal to remove the carrier frequencies, so that a demodulated signal $SGLS_{RT}(t)$ may be obtained. Based on the telemetry information expression, $x_1(t)=d(t)\sin(2\pi f_{d1}t)$, the telemetry data $d(t)=\pm 1$ may be retrieved through a binary phase shift keying (BPSK) demodulation process and a hard decision from the estimated and bandpass-filtered baseband signal $\hat{x}_1(t)$. FIG. 14 illustrates exemplary demodulation results of telemetry data.

Further, numerical simulations are performed to demonstrate the implementation of the disclosed hybrid modulation and hybrid demodulation for telemetry, command and ranging signals in SGLS. In these simulations, the carrier frequency is set to 10 Mhz and the sampling frequency is set to 80 Mhz. Further, HM signals may be generated, and the HM signals may go through an AWGN channel with noises added during the test according to different application needs. At the receiver side, carrier frequency and phase tracking may be performed based on the Costas Loop described above, then the hybrid demodulation may be performed to recover the SGLS data. During the simulation, each frame runs 2 ms.

For the telemetry data, the data rate is 32 kb/s, the telemetry bits per frame is 64, and each telemetry bit has 2500 samples. Further, for the telemetry data, SNR and Eb/No may satisfy the follow equation:

$$\frac{E_b}{N_o}(\text{dB}) = SNR(\text{dB}) + 10 * \log_{10} 2500 = SNR(\text{dB}) + 33.98 \text{ dB}.$$

Figure 15:
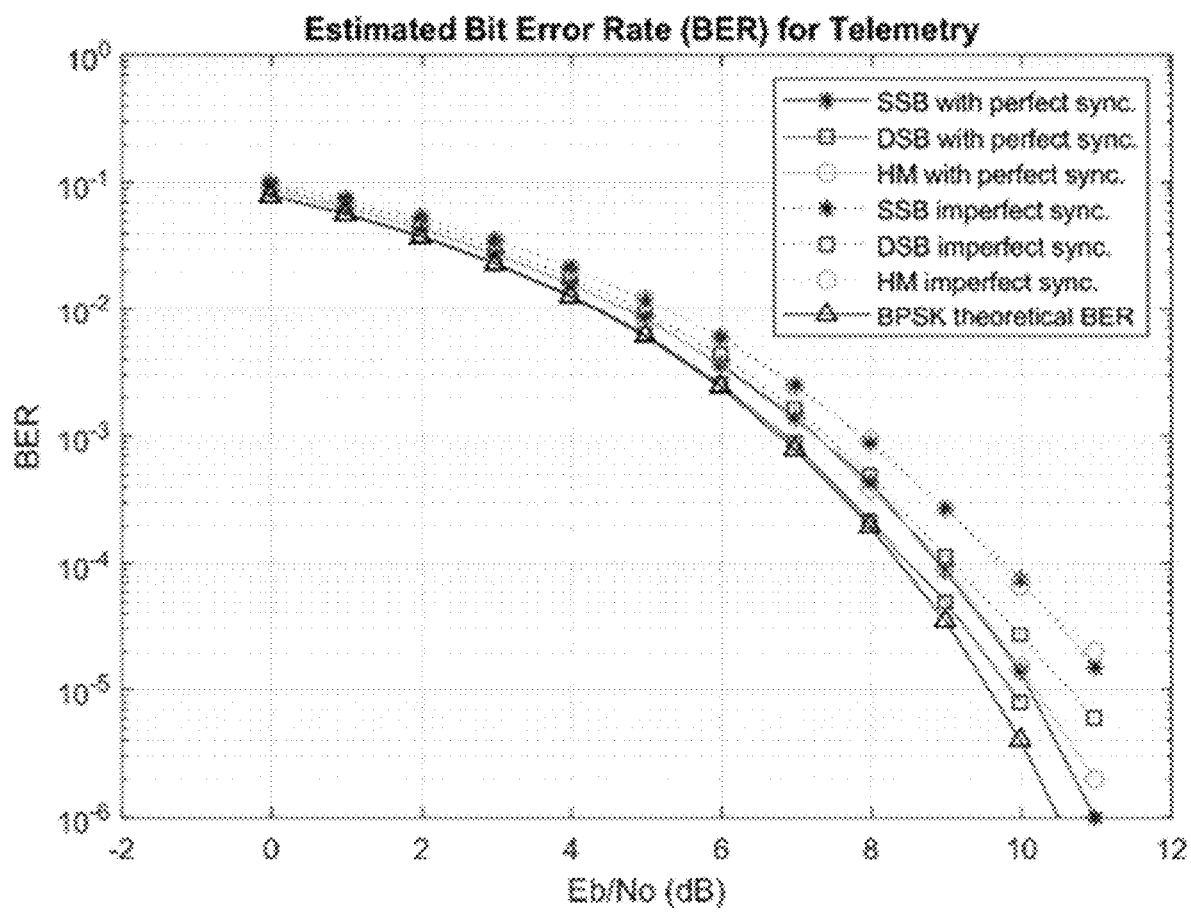
FIG. 15 illustrates bit-error-rate (BER) results for simulated SGLS telemetry data.

FIG. 15 illustrates bit-error-rate (BER) results for simulated SGLS telemetry data. It should be noted that the term, "imperfect sync.", shown in the figure means the synchronization achieved by the Costas loop.

Figure 16:
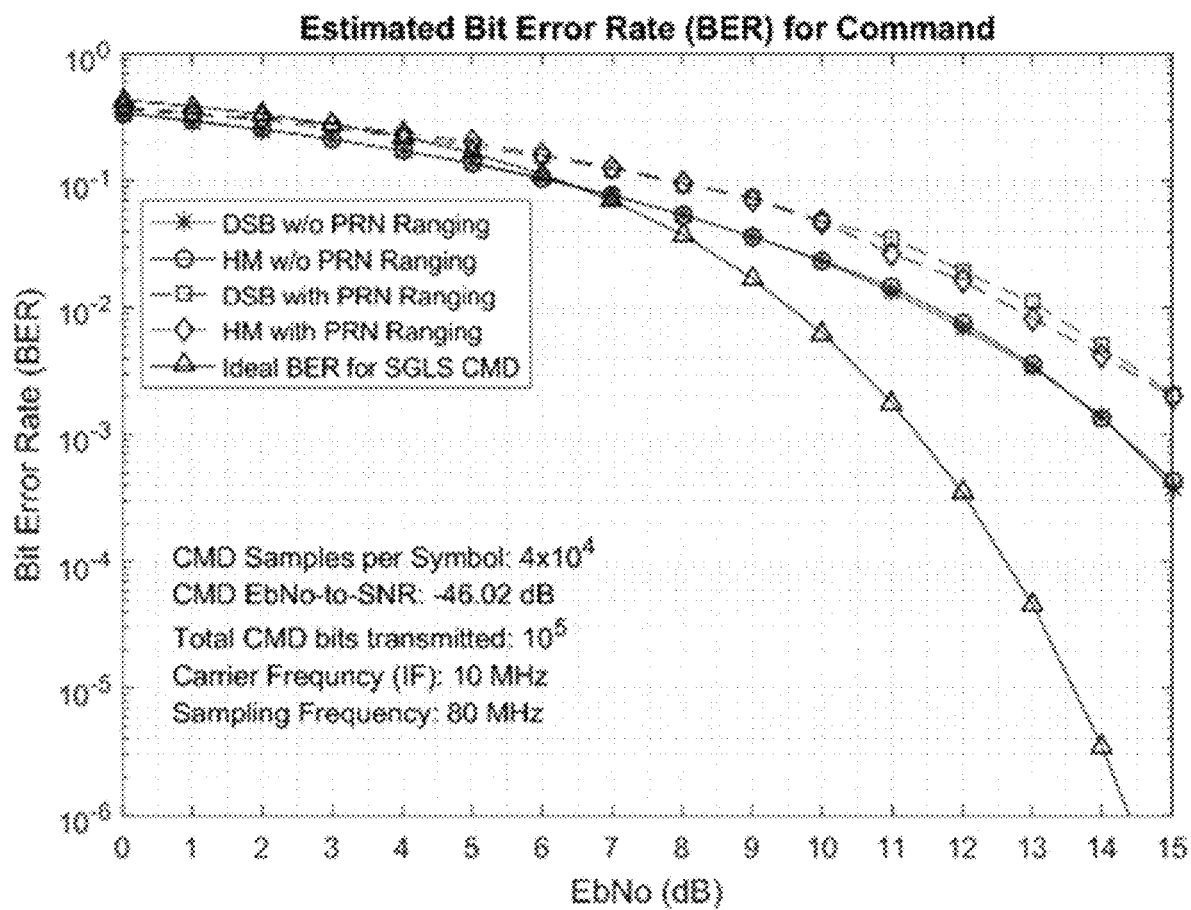
FIG. 16 illustrates BER results for simulated SGLS command data.

FIG. 16 illustrates BER results for simulated SGLS command data. The results are compared with an ideal BER for SGLS command data.

Figure 17:
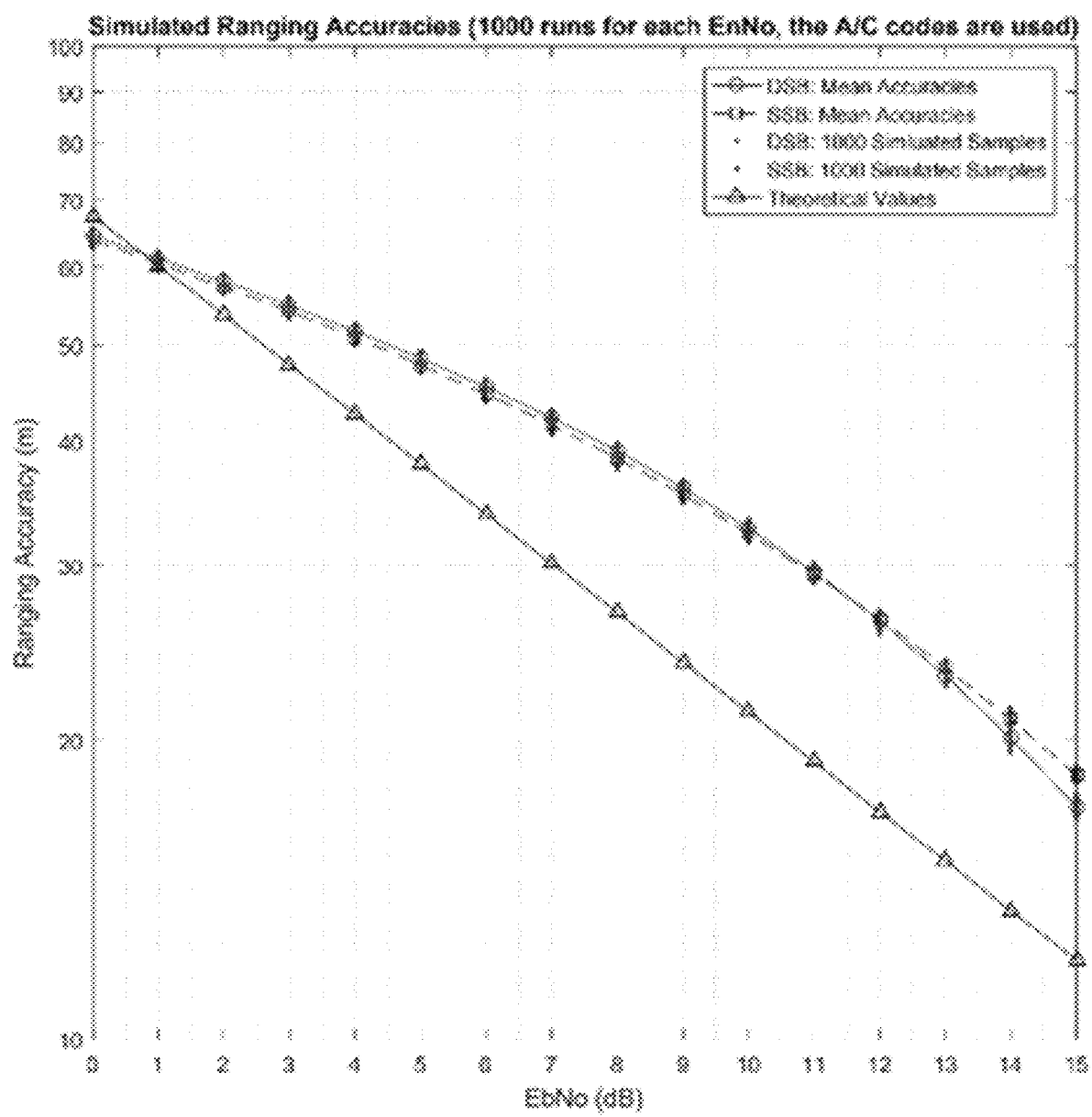
FIG. 17 illustrates simulation accuracy for SGLS ranging data.

FIG. 17 illustrates simulation accuracy for SGLS ranging data. The theoretical value of the ranging accuracy may be derived from equation:

$$\sigma_r = \frac{c}{2f_{cl}}\left(\frac{1}{2\pi}\sqrt{\frac{1}{\alpha(S/N_0)\frac{1}{B_L}}}\right) \quad (25)$$

where $\sigma_r$ is the range determination accuracy with the unit of meters, $f_{cl}$ is the clock frequency, $S/N_0$ is the carrier signal to noise ratio, $B_L$ is the bandwidth of the Phase-Locked Loop bandwidth, and $\alpha$ is 2 for square-wave and 1 for sinewave ranging clock.

According to the disclosed method for hybrid modulation and demodulation, a hybrid modulation structure is designed to combine the SSB modulation and the DSB modulation for SGLS, such that power consumption and spectral usage can be saved without hardware and software upgrades on satellites. Compared to a DSB waveform, the hybrid waveform obtained by the disclosed method cut the required bandwidth in half, while giving the same bit error rate (BER) performance. Further, the implementation losses associated with the disclosed hybrid modulation-demodulation processes are negligible, which demonstrates the feasibility of SSB in SGLS.

Figure 18:
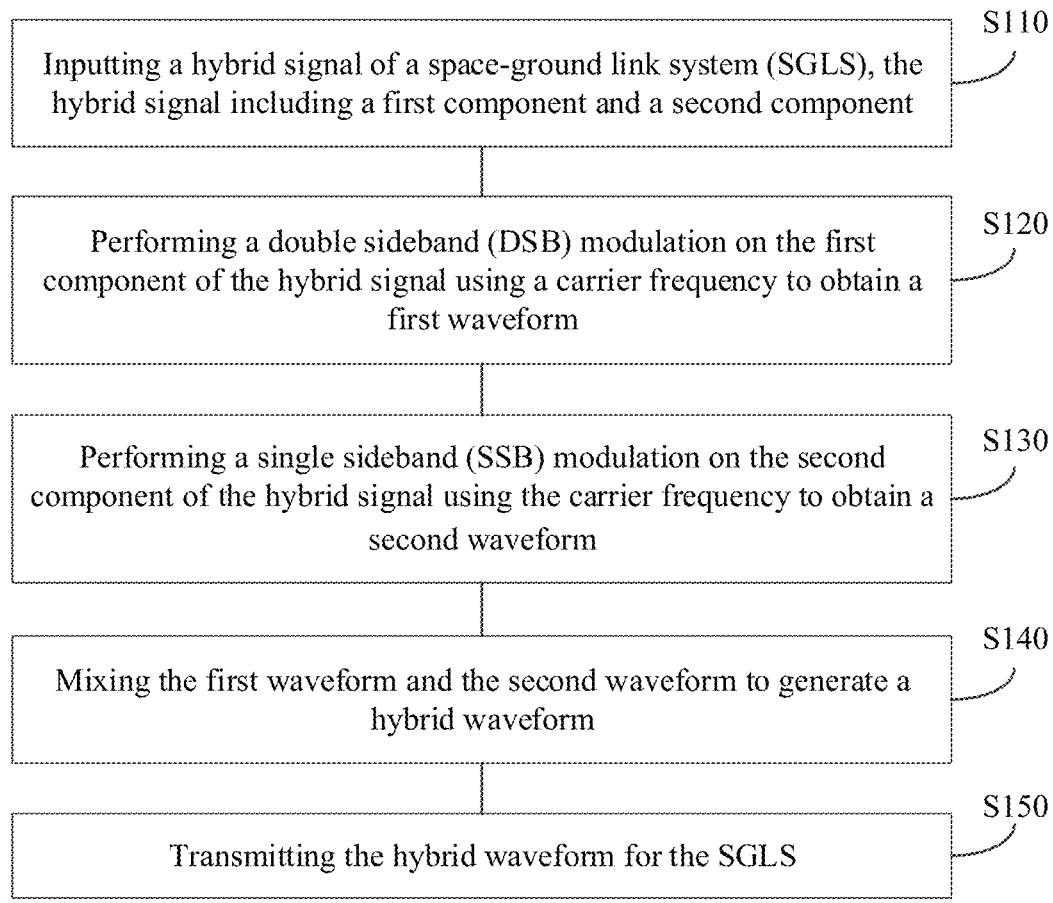
FIG. 18 illustrates a schematic flowchart of an exemplary hybrid modulation method according to various embodiments of the present disclosure.

The present disclosure provides a hybrid modulation method. FIG. 18 illustrates a schematic flowchart of an exemplary hybrid modulation method according to various embodiments of the present disclosure. The hybrid modulation method may be applied to a communication system, e.g., a system including transmitter and receiver. Referring to FIG. 18, the hybrid modulation method may include inputting a hybrid signal of a space-ground link system (SGLS), the hybrid signal including a first component and a second component (S110); performing a double sideband (DSB) modulation on the first component of the hybrid signal using a carrier frequency to obtain a first waveform (S120); performing a single sideband (SSB) modulation on the second component of the hybrid signal using the carrier frequency to obtain a second waveform (S130); and mixing the first waveform and the second waveform to generate a hybrid waveform (S140). In one embodiment, the hybrid modulation method may further include transmitting the hybrid waveform for the SGLS (S150).

In one embodiment, the hybrid signal may be a baseband signal of a space-ground link system (SGLS), the first component of the hybrid signal may include a command signal, and the second component of the hybrid signal may include a telemetry signal and a ranging signal. For the details of applying the hybrid modulation method to modulate the command signal, the telemetry signal, and the ranging signal, reference may be made to the embodiments described above.

In one embodiment, prior to transmitting the hybrid waveform (S150), the hybrid modulation method may further include passing the mixed waveform of the first waveform and the second waveform through a passband filter to generate the hybrid waveform (e.g., the hybrid waveform is a passband signal). Therefore, when transmitting the hybrid waveform, the passband signal may be transmitted.

Figure 19:
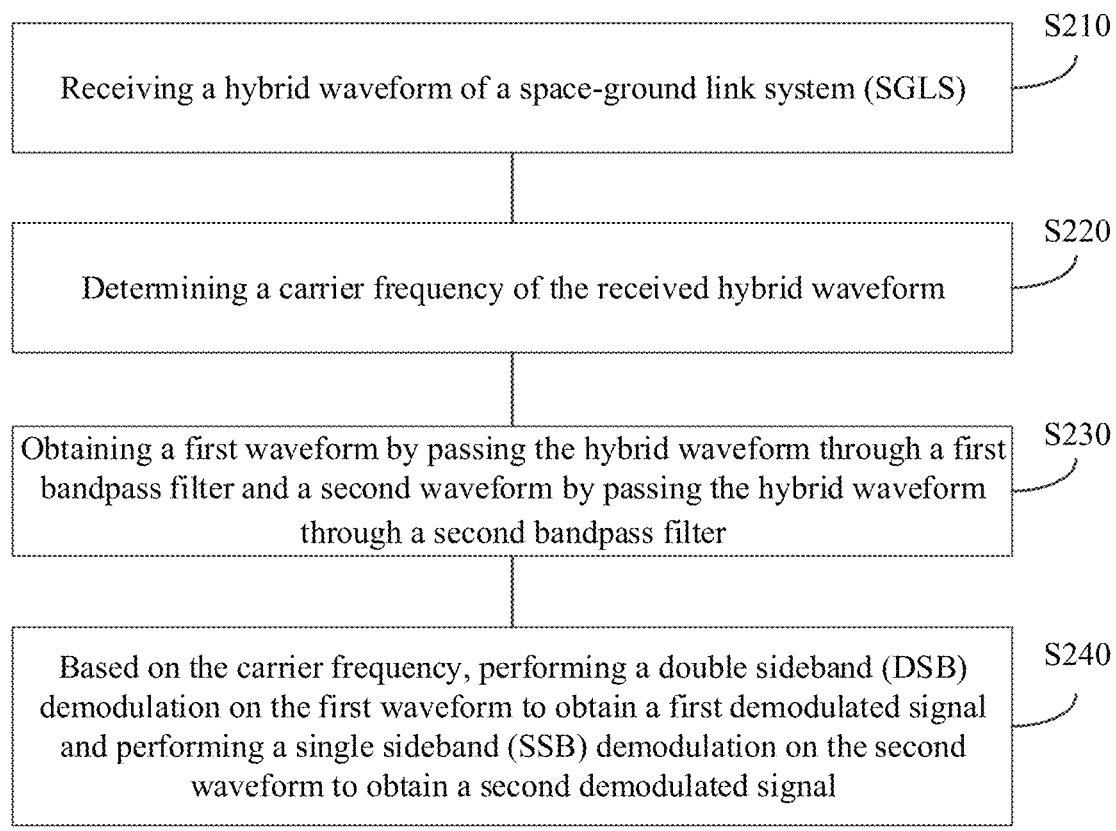
FIG. 19 illustrates a schematic flowchart of an exemplary hybrid demodulation method according to various embodiments of the present disclosure.

The present disclosure also provides a hybrid demodulation method to recover the modulated hybrid signal. FIG. 19 illustrates a schematic flowchart of an exemplary hybrid demodulation method. Referring to FIG. 19, the hybrid demodulation method may include receiving a hybrid waveform of a space-ground link system (SGLS) (S210); determining a carrier frequency of the received hybrid waveform (S220); obtaining a first waveform by passing the received hybrid waveform through a first bandpass filter and obtaining a second waveform by passing the received hybrid waveform through a second bandpass filter (S230); and performing, based on the carrier frequency, a DSB demodulation on the first waveform to obtain a first demodulated signal and performing, based on the carrier frequency, an SSB demodulation on the second waveform to obtain a second demodulated signal (S240). In one embodiment, the method may also include tracking the carrier frequency and phase using a Costas loop, and the tracked carrier frequency and phase may be used for performing the DSB demodulation and the SSB demodulation.

In one embodiment, the first demodulated signal may include a command signal, the method may further include identifying subcarrier frequencies from the first demodulated signal. For example, the subcarrier frequencies for the command signal may include 65 KHz, 76 KHz, and 96 KHz, and the subcarrier frequencies may be determined according to one of the following three methods: finding peaks in FFT plots; frequency tracking by a Costas loop; and signal matching based on frequency correlation. In one embodiment, the method may further include determining the command data corresponding to each subcarrier frequency.

In one embodiment, the second demodulated signal may include a telemetry signal and a ranging signal, and the method may further include passing the second demodulated signal through a low pass filter to recover the ranging data. For example, a first component of the second demodulated signal may be the output of the low pass filter (with a characteristic frequency of 1 MHz, e.g., signals with a frequency higher than 1 MHz will be blocked by the low pass filter), and hard limits may be applied to the first component of the second demodulated signal to obtain the ranging data. In one embodiment, the ranging data may include pseudorandom noise for ranging.

Moreover, the method may also include passing the second demodulated signal through a third bandpass filter to obtain a second component of the second demodulated signal; performing a binary phase shift keying (BPSK) demodulation on the second component of the second demodulated signal to obtain a BPSK demodulated signal; and applying mean and hard limits to the BPSK demodulated signal to obtain the telemetry data. In one embodiment, the third bandpass filter may allow signals in a frequency range near the subcarrier frequency of the telemetry signal. For example, the subcarrier frequency of the telemetry signal is 1.25 MHz, and the third bandpass filter may allow signals in a frequency range of approximately 1.20 MHz to 1.30 MHz to pass through.

According to the disclosed hybrid modulation and demodulation methods, a hybrid modulation structure is designed to combine the SSB modulation and the DSB modulation for SGLS, such that power consumption and spectral usage can be saved without hardware and software upgrades on satellites. Compared to a DSB waveform, the hybrid waveform obtained by the disclosed method cut the required bandwidth in half, while giving the same bit error rate (BER) performance. Further, the implementation losses associated with the disclosed hybrid modulation-demodulation processes are negligible, which demonstrates the feasibility of SSB in SGLS.

Figure 20:
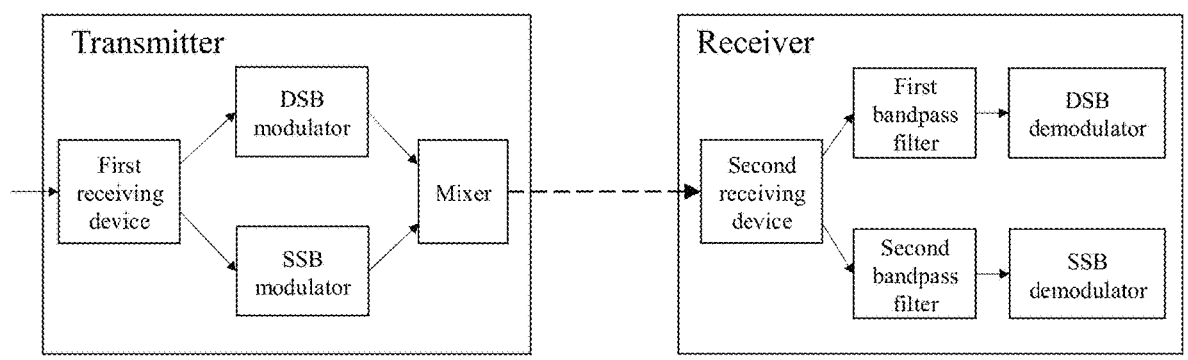
FIG. 20 illustrates a schematic diagram of an exemplary system for hybrid modulation and demodulation according to various embodiments of the present disclosure.

The present disclosure also provides a system for hybrid modulation and demodulation. FIG. 20 illustrates a schematic diagram of an exemplary system for hybrid modulation and demodulation according to various embodiments of the present disclosure.

Referring to FIG. 20, the system may include a transmitter and a receiver. The transmitter may be configured to receive a hybrid signal of a space-ground link system (SGLS), the hybrid signal including a first component and a second component; perform a double sideband (DSB) modulation on the first component of the hybrid signal using a carrier frequency to obtain a first waveform; perform a single sideband (SSB) modulation on the second component of the hybrid signal using the carrier frequency to obtain a second waveform; mix the first waveform and the second waveform to generate a hybrid waveform, and transmit the hybrid waveform.

In one embodiment, the hybrid signal may be a baseband signal of an SGLS, the first component of the hybrid signal may include a command signal, and the second component of the hybrid signal may include a telemetry signal and a ranging signal. Accordingly, the transmitter may be configured to perform the DSB modulation on the command signal and perform the SSB modulation on the telemetry signal and the ranging signal. For the details of the modulation of the baseband signal, reference may be made to the embodiments described above.

In one embodiment, the transmitter may include a first receiving device, a DSB modulator, an SSB modulator, and a mixer. The first receiving device may be configured to receive the hybrid signal including the first component and the second component. The DSB modulator may be configured to receive the first component of the hybrid signal from the first receiving device and perform a DSB modulation on the first component of the hybrid signal using the carrier frequency to obtain the first waveform. The SSB modulator may be configured to receive the second component of the hybrid signal from the first receiving device and perform an SSB modulation on the second component of the hybrid signal using the carrier frequency to obtain the second waveform. The mixer may be configured to receive and mix the first waveform and the second waveform to generate the hybrid waveform. The mixer may also be configured to transmit the hybrid waveform for the SGLS.

In one embodiment, the mixer may include a passband filter, and after mixing the first waveform and the second wave form, the mixer may be configured to generate the hybrid waveform by filtering the mixed waveform using the passband filter. Therefore, the hybrid waveform may be a passband signal.

The receiver may be configured to receive the transmitted hybrid waveform; determine the carrier frequency of the hybrid waveform; separate the first waveform and the second waveform of the hybrid waveform; perform, based on the carrier frequency, a DSB demodulation on the first waveform to obtain a first demodulated signal; perform, based on the carrier frequency, an SSB demodulation on the second waveform to obtain a second demodulated signal. In one embodiment, to determine the carrier frequency of the hybrid waveform, the receiver may be configured to track the carrier frequency and phase of the received hybrid waveform, and the carrier frequency used in the DSB demodulation and the SSB demodulation may be the carrier frequency tracked by the receiver.

In one embodiment, the receiver may include a second receiving device, a first bandpass filter, a second bandpass filter, a DSB demodulator, and an SSB demodulator. The second receiving device may be configured to receive the transmitted hybrid waveform. The first bandpass filter may be configured to filter the hybrid waveform to obtain the first waveform. The second bandpass filter may be configured to filter the hybrid waveform to obtain the second waveform. The DSB demodulator may be configured to receive the first waveform of the hybrid waveform and perform, based on the carrier frequency, a DSB demodulation on the first waveform to obtain the first demodulated signal. The SSB demodulator may be configured to receive the second waveform of the hybrid waveform and perform, based on the carrier frequency, an SSB demodulation on the second waveform to obtain the second demodulated signal.

In one embodiment, the receiver may further include a Costas loop, and the Costas loop may be configured to track the carrier frequency and phase of the hybrid waveform. The tracked carrier frequency may be used by the DSB demodulator and the SSB demodulator to respectively obtain the first demodulated signal and the second demodulated signal.

In one embodiment, the first demodulated signal may include a command signal, the receiver may further include a frequency identifier, configured to identify subcarrier frequencies from the first demodulated signal. For example, the subcarrier frequencies for the command signal may include 65 KHz, 76 KHz, and 96 KHz, and the subcarrier frequencies may be determined according to one of the following three methods: finding peaks in FFT plots; frequency tracking by a Costas loop; and signal matching based on frequency correlation. Further, the receiver may include a command-data analyzer, configured to determine the command data corresponding to each subcarrier frequency.

In one embodiment, the second demodulated signal may include a telemetry signal and a ranging signal, and the receiver may further include a low pass filter, and the low pass filter may be configured to allow a first component of the second demodulated signal to pass through. For example, the low pass filter may allow signals with a frequency under 1 MHz to pass through. Further, the receiver may include a first regulator, configured to apply hard limits to the first component of the second demodulated signal and obtain the ranging data. In one embodiment, the ranging data may include pseudorandom noise for ranging.

Moreover, the receiver may also include a third bandpass filter, and the third bandpass filter may be configured to allow a second component of the second demodulated signal to pass through. In one embodiment, the subcarrier frequency of the telemetry signal is 1.25 MHz, and the third bandpass filter may allow signals in a frequency range of approximately 1.20 MHz to 1.30 MHz to pass through. Further, the receiver may also include a BPSK demodulator, configured to perform a BPSK demodulation on the second component of the second demodulated signal; and a second regulator, configured to apply mean and hard limits to the output of the BPSK demodulator to obtain the telemetry data.

According to the disclosed system for hybrid modulation and demodulation, a hybrid modulation structure is designed to combine the SSB modulation and the DSB modulation for SGLS, such that power consumption and spectral usage can be saved without hardware and software upgrades on satellites. Compared to DSB waveforms, the hybrid waveforms obtained by the disclosed method cut the required bandwidth in half, while giving the same bit error rate (BER) performance. Further, the implementation losses associated with the disclosed hybrid modulation-demodulation processes are negligible, which demonstrates the feasibility of SSB in SGLS.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A system for hybrid modulation and demodulation, comprising: a transmitter, configured to:

receive a hybrid signal of a space-ground link system (SGLS), the hybrid signal including a first component and a second component; perform a double sideband (DSB) modulation on the first component of the hybrid signal utilizing a carrier frequency to obtain a first waveform; perform a single sideband (SSB) modulation on the second component of the hybrid signal utilizing the carrier frequency to obtain a second waveform; mix the first waveform with double sidebands and the second waveform with a single sideband to generate a hybrid waveform with mixed double sidebands and single sideband; and transmit the hybrid waveform for the SGLS; and a receiver, configured to: receive the hybrid waveform from the transmitter; determine the carrier frequency of the hybrid waveform; separate the first waveform including a command signal and the second waveform including a telemetry signal and a ranging signal of the hybrid waveform; perform, based on the carrier frequency, a DSB demodulation on the first waveform to obtain a first demodulated signal; and perform, based on the carrier frequency, an SSB demodulation on the second waveform to obtain a second demodulated signal.

2. The system according to claim 1, wherein the transmitter includes:
a first signal receiver, configured to receive the hybrid signal including the first component and the second component;
a DSB modulator, configured to receive the first component of the hybrid signal from the first signal receiver and perform the DSB modulation on the first component of the hybrid signal utilizing the carrier frequency to obtain the first waveform;
an SSB modulator, configured to receive the second component of the hybrid signal from the first signal receiver and perform the SSB modulation on the second component of the hybrid signal utilizing the carrier frequency to obtain the second waveform; and
a mixer, configured to receive and mix the first waveform with the double sidebands and the second waveform with the single sideband to generate the hybrid waveform with the mixed double sidebands and single sideband and transmit the hybrid waveform.

3. The system according to claim 2, wherein:
the mixer further includes a passband filter; and
the mixer is configured to pass a mixed waveform of the first waveform with the double sidebands and the second waveform with the single sideband through the passband filter to generate the hybrid waveform with the mixed double sidebands and single sideband.

4. The system according to claim 1, wherein the receiver includes:
a second signal receiver, configured to receive the hybrid waveform from the transmitter;
a first bandpass filter, configured to filter the hybrid waveform to obtain the first waveform;
a second bandpass filter, configured to filter the hybrid waveform to obtain the second waveform;
a DSB demodulator, configured to receive the first waveform of the hybrid waveform and perform the DSB demodulation on the first waveform to obtain the first demodulated signal; and
an SSB demodulator, configured to receive the second waveform of the hybrid waveform and perform the SSB demodulation on the second waveform to obtain the second demodulated signal.

5. The system according to claim 4, wherein the receiver further includes:
a Costas loop, configured to track the carrier frequency and a carrier phase of the hybrid waveform, wherein the tracked carrier frequency is utilized by the DSB demodulator and the SSB demodulator to respectively obtain the first demodulated signal and the second demodulated signal.

6. The system according to claim 5, wherein:
the first demodulated signal includes the command signal; and
the receiver further includes:
a frequency identifier, configured to identify subcarrier frequencies from the first demodulated signal, and
a command-data analyzer, configured to determine command data corresponding to each subcarrier frequency.

7. The system according to claim 6, wherein the frequency identifier identifies the subcarrier frequencies from the first demodulated signal utilizing a process including one of:
finding peaks in fast Fourier transform (FFT) plots of the first demodulated signal;
a frequency tracking performed by the Costas loop; and
signal matching based on frequency correlation.

8. The system according to claim 5, wherein:
the second demodulated signal includes the telemetry signal and the ranging signal; and
the receiver further includes:
a low pass filter, configured to allow a first component of the second demodulated signal to pass through,
a first regulator, configured to apply hard limits to the first component of the second demodulated signal and obtain ranging data, wherein the ranging data includes pseudorandom noise for ranging,
a third bandpass filter, configured to allow a second component of the second demodulated signal to pass through,
a binary phase shift keying (BPSK) demodulator, configured to perform a BPSK demodulation on the second component of the second demodulated signal, and
a second regulator, configured to apply mean and hard limits to an output of the BPSK demodulator to obtain telemetry data.

9. The system according to claim 8, wherein:
a subcarrier frequency of the telemetry signal includes 1.25 MegaHertz (MHz);
the third bandpass filter allows signals in a frequency range of approximately 1.20 MHz to 1.30 MHz to pass through; and
the low pass filter allows signals with a frequency under 1 MHz to pass through.

10. The system according to claim 1, wherein:
the first component of the hybrid signal includes the command signal; and
the second component of the hybrid signal includes the telemetry signal and the ranging signal.

11. A hybrid modulation method, comprising:
inputting a hybrid signal of a space-ground link system (SGLS), the hybrid signal including a first component and a second component;
performing a double sideband (DSB) modulation on the first component of the hybrid signal utilizing a carrier frequency to obtain a first waveform;
performing a single sideband (SSB) modulation on the second component of the hybrid signal utilizing the carrier frequency to obtain a second waveform;
mixing the first waveform with double sidebands and the second waveform with a single sideband to generate a hybrid waveform with mixed double sidebands and single sideband; and
transmitting the hybrid waveform for the SGLS with reduced bandwidth and improved spectrum efficiency.

12. The method according to claim 11, wherein:
the first component of the hybrid signal includes a command signal; and the second component of the hybrid signal includes a telemetry signal and a ranging signal.

13. The method according to claim 11, wherein:
mixing the first waveform with the double sidebands and the second waveform with the single sideband to generate the hybrid waveform with the mixed double sidebands and single sideband includes passing a mixed waveform of the first waveform with the double sidebands and the second waveform with the single sideband through a passband filter to generate the hybrid waveform with the mixed double sidebands and single sideband.

14. The method according to claim 12, further including:
a subcarrier frequency of the telemetry signal includes 1.25 MegaHertz (MHz); and
subcarrier frequencies of the command signal include 65 KiloHertz (KHz), 76 KHz, and 96 KHz.

15. A hybrid demodulation method, comprising:
receiving a hybrid waveform of a space-ground link system (SGLS);
determining a carrier frequency of the hybrid waveform;
obtaining a first waveform by passing the received hybrid waveform through a first bandpass filter and a second waveform by passing the received hybrid waveform through a second bandpass filter, wherein the first waveform includes a command signal and the second waveform includes a telemetry signal and a ranging signal;
performing, based on the carrier frequency, a double sideband (DSB) demodulation on the first waveform to obtain a first demodulated signal; and
performing, based on the carrier frequency, a single sideband (SSB) demodulation on the second waveform to obtain a second demodulated signal.

16. The method according to claim 15, wherein determining the carrier frequency of the hybrid waveform includes:
utilizing a Costas loop to track the carrier frequency and a carrier phase of the hybrid waveform, wherein the tracked carrier frequency is utilized for performing the DSB demodulation and the SSB demodulation.

17. The method according to claim 16, wherein:
the first demodulated signal includes the command signal; and
the hybrid demodulation method further includes:
identifying subcarrier frequencies from the first demodulated signal, and
determining command data corresponding to each subcarrier frequency.

18. The method according to claim 17, wherein identifying the subcarrier frequencies from the first demodulated signal utilizes a process including one of:
finding peaks in fast Fourier transform (FFT) plots of the first demodulated signal;
a frequency tracking performed by the Costas loop; and
signal matching based on frequency correlation.

19. The method according to claim 15, wherein:
the second demodulated signal includes the telemetry signal and the ranging signal; and
the hybrid demodulation method further includes:
passing the second demodulated signal through a low pass filter to obtain a first component of the second demodulated signal,
applying hard limits to the first component of the second demodulated signal to obtain the ranging data, wherein the ranging data includes pseudorandom noise for ranging,
passing the second demodulated signal through a third bandpass filter to obtain a second component of the second demodulated signal,
performing a binary phase shift keying (BPSK) demodulation on the second component of the second demodulated signal to obtain a BPSK demodulated signal, and
applying mean and hard limits to the BPSK demodulated signal to obtain the telemetry data.

20. The method according to claim 19, wherein:
a subcarrier frequency of the telemetry signal is 1.25 MegaHertz (MHz);
the third bandpass filter allows signals in a frequency range of approximately 1.20 MHz to 1.30 MHz to pass through; and
the low pass filter allows signals with a frequency under 1 MHz to pass through.

* * * * *